United States Patent
Kinoshita (10) Patent No.: US 10,665,753 B2
(45) Date of Patent: May 26, 2020

(54) VERTICAL-TYPE ULTRAVIOLET LIGHT-EMITTING DIODE

(71) Applicant: Stanley Electric Co., Ltd., Tokyo (JP)

(72) Inventor: Toru Kinoshita, Yamaguchi (JP)

(73) Assignee: Stanley Electric Co., Ltd., Tokyo (JP)

( * ) Notice: Subject to any disclaimer, the term of this patent is extended or adjusted under 35 U.S.C. 154(b) by 22 days.

(21) Appl. No.: 16/081,439

(22) PCT Filed: Feb. 21, 2017

(86) PCT No.: PCT/JP2017/006398
§ 371 (c)(1),
(2) Date: Aug. 31, 2018

(87) PCT Pub. No.: WO2017/150280
PCT Pub. Date: Sep. 8, 2017

(65) Prior Publication Data
US 2019/0067523 A1    Feb. 28, 2019

(30) Foreign Application Priority Data
Mar. 1, 2016  (JP) .................. 2016-039249

(51) Int. Cl.
*H01L 33/38*    (2010.01)
*H01L 33/32*    (2010.01)
(Continued)

(52) U.S. Cl.
CPC ............ *H01L 33/38* (2013.01); *H01L 21/205* (2013.01); *H01L 33/06* (2013.01); *H01L 33/16* (2013.01);
(Continued)

(58) Field of Classification Search
CPC combination set(s) only.
See application file for complete search history.

(56) References Cited

U.S. PATENT DOCUMENTS 8,963,290 B2    2/2015  Toba et al.
2005/0062060 A1  3/2005  Nagai et al.
(Continued)

FOREIGN PATENT DOCUMENTS

EP    2660855 A1    11/2013
JP    2001148357 A   5/2001
(Continued)

OTHER PUBLICATIONS

Extended European Search Report, dated Sep. 4, 2019.
(Continued)

*Primary Examiner* — Ratisha Mehta
(74) *Attorney, Agent, or Firm* — Cahn & Samuels, LLP (57) ABSTRACT

A vertical ultraviolet light-emitting diode has, on an aluminum polar plane of an n-type AlN single crystal substrate, a layer represented by n-type $Al_XGa_{1-X}N$ (wherein X is a rational number satisfying $0.5 \leq X \leq 1.0$), an active layer, a layer represented by p-type $Al_YGa_{1-Y}N$ (wherein Y is a rational number satisfying $0.5 \leq Y \leq 1.0$) and a p-type GaN layer in this order and which is equipped with a p-electrode formed on the p-type GaN layer and an n-electrode partially provided on a plane on the opposite side to the aluminum polar plane of the n-type AlN single crystal substrate, preferably an n-electrode formed by providing at least one opening functioning as a light extraction window, wherein the shortest distance between the n-electrode and an arbitrary point in a portion where the n-electrode is not provided, is not more than 400 μm.

5 Claims, 8 Drawing Sheets

(51) Int. Cl.
- *H01L 33/16* (2010.01)
- *H01L 21/205* (2006.01)
- *H01L 33/06* (2010.01)
- *H01L 33/00* (2010.01)
- *H01L 33/02* (2010.01)

(52) U.S. Cl.
CPC .......... *H01L 33/32* (2013.01); *H01L 33/0079* (2013.01); *H01L 33/02* (2013.01)

(56) References Cited

U.S. PATENT DOCUMENTS

| | | | |
|---|---|---|---|
| 2008/0017878 A1* | 1/2008 | Kuramoto | H01L 33/38 257/99 |
| 2010/0032718 A1 | 2/2010 | Yu et al. | |
| 2012/0049156 A1* | 3/2012 | Ohta | H01L 21/0237 257/13 |
| 2013/0082290 A1 | 4/2013 | Yan et al. | |
| 2014/0103289 A1 | 4/2014 | Liao et al. | |
| 2015/0228845 A1 | 8/2015 | Kadowaki et al. | |
| 2016/0254391 A1 | 9/2016 | Kinoshita et al. | |
| 2019/0312178 A1 | 10/2019 | Obata | |

FOREIGN PATENT DOCUMENTS

| | | |
|---|---|---|
| JP | 2003069075 A | 3/2003 |
| JP | 2014-049687 A | 3/2014 |
| JP | 2014-529190 A | 10/2014 |
| JP | 2015-078076 A | 4/2015 |
| JP | 2016-015379 A | 1/2016 |
| JP | 2016018951 A | 2/2016 |
| WO | 2012012010 A2 | 1/2012 |
| WO | 2012090252 A1 | 7/2012 |

OTHER PUBLICATIONS

International Search Report, PCT/JP2017/006398, dated Sep. 2017.
Chichibu et al., "Origin of defect-insensitive emission probability in In-containing (Al, In, Ga)N alloy semiconductors", Natural Materials, vol. 5, 810-816 (2006).
Kinoshita et al., "Performance and Reliability of Deep-Ultraviolet Light-Emitting Diodes Fabricated on AlN Substrates Prepared by Hydride Vapor Phase Epitaxy", Applied Physics Express, 6, 092103-1 to -3 (2013).
English Abstract of JP 2016018951, Feb. 1, 2016.
English Abstract of JP 2015078076, Apr. 23, 2016.
English Abstract of WO 2012090252, Jun. 5, 2014.
English Abstract of JP 2014049687, Mar. 17, 2014.
English Abstract of JP 2014529190, Oct. 30, 2014.
English Abstract of JP 2016015379, Jan. 28, 2016.
English Abstract of JP 2001148357, May 29, 2001.
English Abstract of JP 2003069075, Mar. 7, 2003.
International Preliminary Report on Patentability, PCT/JP2017/006398 dated Sep. 2018.
Zhao et al., "Toward ultimate efficiency: progress and prospects on planar and 3D nanostructured nonpolar and semipolar InGaN light-emitting diodes", Advances in Optics and Photonics, vol. 10, No. 1, Mar. 2018, 246-308.

* cited by examiner

CMP Performed
(No Damage Layer)

FIG. 7

No CMP Performed
(Damage Layer: 70nm)

FIG. 8

VERTICAL-TYPE ULTRAVIOLET LIGHT-EMITTING DIODE

This application is a U.S. national stage application of PCT/JP2017/006398 filed on 21 Feb. 2017 and claims priority to Japanese patent document 2016-039249 filed on 1 Mar. 2016, the entireties of which are incorporated herein by reference.

TECHNICAL FIELD

The present invention relates to a vertical ultraviolet light-emitting diode using an n-type AlN (aluminum nitride) single crystal substrate.

BACKGROUND OF THE INVENTION

A group III nitride semiconductor is a semiconductor material composed of a mixed crystal of indium nitride (InN), gallium nitride (GaN) and aluminum nitride (AlN), and by controlling a composition of a mixed crystal of In, Ga and Al that are group III elements, it becomes possible to manufacture light-emitting elements having high efficiency in a wavelength range of infrared region to ultraviolet region corresponding to their respective band gap energies (0.7 eV (InN), 3.4 eV (GaN) and 6.1 eV (AlN)). On that account, blue light-emitting diodes using the group III nitride semiconductors are now being used for a wide range of applications including illumination, as white light-emitting diodes that are combinations of them and fluorescent materials.

The blue light-emitting diode is formed of an InGaN-based material that is a mixed crystal material of InN and GaN, and in general, it is manufactured by forming, on a C-plane ((0001) plane) sapphire substrate, an n-type GaN layer, an InGaN light-emitting layer and a p-type GaN layer in this order through a metal organic chemical vapor phase deposition (MOCVD) method. In this case, owing to a difference in lattice constant or thermal expansion coefficient between the sapphire substrate and the GaN layer, crystal defects (dislocation) causing lowering of luminous efficiency are highly densely formed in the GaN layer, but by the composition modulation effect of In in the active layer, high-efficiency light emission is achieved (See non patent document 1).

Since the sapphire substrate has insulation property, a structure in which the n-type and the p-type electrodes to drive the light-emitting diode are formed on the same plane side of the plane (Ga polar plane) where the group III nitride layers have been formed is generally widely adopted. Moreover, for the purpose of obtaining high output by increasing the applied current, a vertical light-emitting diode structure in which by peeling the sapphire substrate from the GaN layer through a laser lift-off method or the like or by using a conductive GaN substrate, counter electrodes have been formed on a rear plane (−C-plane, nitrogen polar plane) of the n-type GaN layer or the n-type GaN substrate and on a surface of the p-type GaN layer has been proposed (See, for example, patent documents 1 and 2).

On the other hand, in an ultraviolet light-emitting diode having a shorter wavelength than the blue light-emitting diode, an aluminum gallium nitride (AlGaN) material that is a mixed crystal-based material of GaN and AlN is used. Also in this case, a sapphire substrate is mainly used as a substrate material, and an ultraviolet light-emitting diode is manufactured by a process similar to that for the InGaN-based light-emitting element. In the case of the ultraviolet light-emitting diode, however, decrease in luminous efficiency and reliability becomes noticeable owing to the dislocation formed in the AlGaN layer, and therefore, a technique of using an AlN single crystal having a physical constant close to that of the AlGaN layer, for the substrate has been proposed. It has been reported that by adopting the AlN single crystal for the substrate, high luminous efficiency and high reliability are obtained. (See non patent document 2).

If a vertical structure can be adopted also in the ultraviolet light-emitting diode similarly to the InGaN-based light-emitting diode, much higher output can be expected. With regard to the AlGaN-based materials, however, an effective substrate peeling means, such as the aforesaid laser lift-off method, has not been developed, and in the present technology level, it is difficult to achieve a vertical ultraviolet light-emitting diode structure using the substrate peeling technique.

Another means to achieve a vertical ultraviolet light-emitting diode is a vertical ultraviolet light-emitting element structure using an n-type conductive AlN substrate (See patent document 3). In the present circumstances, however, the vertical ultraviolet light-emitting diode that uses an n-type conductive AlN substrate and emits light in the ultraviolet region has not been achieved yet.

CITATION LIST

Patent Document

Patent document 1: Japanese Unexamined Patent Application Publication No. 2001-148357
Patent document 2: Japanese Unexamined Patent Application Publication No. 2003-69075
Patent document 3: Japanese Patent No. 5818853

Non Patent Document

Non patent document 1: Nature Materials, Vol. 5, p. 810 (2006)
Non patent document 2: Applied Physics Express, 6, 092103 (2013)

SUMMARY OF INVENTION

In the patent document 3, a vertical semiconductor device equipped with counter electrodes formed on an upper and a lower surfaces of an AlN single crystal substrate having n-type electrical conductivity is disclosed, and it is described that this device can be applied to an ultraviolet light-emitting diode as a semiconductor device.

However, when the present inventors have attempted to manufacture a vertical ultraviolet light-emitting diode by combining the teachings of the patent document 3 with a known process for producing an ultraviolet light-emitting diode, it has been found that in order to obtain higher emission property at a lower operating voltage, there are points to be improved.

Accordingly, it is an object of the present invention to provide a vertical ultraviolet light-emitting diode in which an AlGaN layer and a GaN layer are deposited on an n-type AlN single crystal substrate and which emits light in an ultraviolet region at a low operating voltage with good emission property.

In order to solve the above problem, the present inventors have earnestly studied, and they have manufactured various vertical ultraviolet light-emitting elements each having an AlGaN layer and a GaN layer that are deposited on an n-type AlN single crystal substrate and have evaluated emission property and current-voltage property. As a result, they have found that the shape of an n-electrode formed on a nitrogen polar plane side of the n-type AlN single crystal substrate exerts influence on the enhancement of the emission property and the reduction of the operating voltage, and have accomplished the present invention. In addition, they have found that a damage layer at the interface where the n-electrode is formed and the surface shape exert influence on the enhancement of the emission property and the reduction of the operating voltage, and have accomplished the present invention.

That is to say, a first vertical ultraviolet light-emitting diode according to the present invention is an ultraviolet light-emitting diode having an emission peak wavelength in range of 210 to 300 nm, wherein the ultraviolet light-emitting diode has, on an aluminum polar plane of an n-type AlN single crystal substrate, a layer represented by n-type $Al_XGa_{1-X}N$ (wherein X is a rational number satisfying $0.5 \le X \le 1.0$), an active layer, a layer represented by p-type $Al_YGa_{1-Y}N$ (wherein Y is a rational number satisfying $0.5 \le Y \le 1.0$) and a p-type GaN layer in this order, the ultraviolet light-emitting diode is equipped with a p-electrode formed on the p-type GaN layer and an n-electrode partially provided on a plane on the opposite side to the aluminum polar plane of the n-type AlN single crystal substrate, and the shortest distance between the n-electrode and an arbitrary point in a portion where the n-electrode is not provided, the portion being on the plane on the opposite side, is not more than 400 μm.

A second vertical ultraviolet light-emitting diode according to the present invention is an ultraviolet light-emitting diode having an emission peak wavelength in range of 210 to 300 nm, wherein the ultraviolet light-emitting diode has, on an aluminum polar plane of an n-type AlN single crystal substrate, a layer represented by n-type $Al_XGa_{1-X}N$ (wherein x is a rational number satisfying $0.5 \le X \le 1.0$), an active layer, a layer represented by p-type $Al_YGa_{1-Y}N$ (wherein Y is a rational number satisfying $0.5 \le Y \le 1.0$) and a p-type GaN layer in this order, the ultraviolet light-emitting diode is equipped with a p-electrode formed on the p-type GaN layer and an n-electrode formed on a plane on the opposite side to the aluminum polar plane of the n-type AlN single crystal substrate, the n-electrode being provided with at least one opening functioning as a light extraction window, and the shortest distance between an edge of the n-electrode and an arbitrary point in the opening is not more than 400 μm.

In order to enhance luminous efficiency, the second invention preferably has a plurality of the openings.

In the second invention, in a portion where the n-electrode is formed, a thickness of a damage layer at the portion from the n-type AlN single crystal substrate surface is preferably not more than 50 nm.

In the second invention, in a portion where the n-electrode is formed, at least a part of the portion is preferably a semipolar plane.

A third vertical ultraviolet light-emitting diode according to the present invention is an ultraviolet light-emitting diode having an emission peak wavelength in range of 210 to 300 nm, wherein the ultraviolet light-emitting diode has, on an aluminum polar plane of an n-type AlN single crystal substrate, a layer represented by n-type $Al_XGa_{1-X}N$ (wherein X is a rational number satisfying $0.5 \le X \le 1.0$), an active layer, a layer represented by p-type $Al_YGa_{1-Y}N$ (wherein Y is a rational number satisfying $0.5 \le Y \le 1.0$) and a p-type GaN layer in this order, the ultraviolet light-emitting diode is equipped with a p-electrode formed on the p-type GaN layer and an n-electrode on a plane on the opposite side to the aluminum polar plane of the n-type AlN single crystal substrate, and in a portion where the n-electrode is formed on the n-type AlN single crystal substrate, at least a part of the portion is a semipolar plane.

According to the present invention, a vertical ultraviolet light-emitting diode using an n-type AlN single crystal substrate is provided, which has not been achieved conventionally, and the vertical ultraviolet light-emitting diode is capable of enhancing its output property and reducing its operating voltage.

In usual, it is thought that the window to extract light (in the light-emitting surface, a portion where the n-electrode is not formed, preferably an opening formed by the n-electrode) is preferably wider because a large amount of light can be extracted. However, it has been found that in a vertical ultraviolet light-emitting diode using an n-type AlN single crystal substrate, an emission output distribution in the window becomes large unless the window has a specific size, and if a damage layer is present at the interface between the n-type AlN single crystal substrate and the n-electrode, the operating voltage increases. Then, the present invention has solved them. Therefore, it becomes possible to manufacture an ultraviolet light-emitting diode that is operable at a lower driving current value than a conventional one.

Moreover, by making the n-type AlN single crystal substrate plane, on which the n-electrode is formed, into a semipolar plane, the electrode resistance is reduced, and the driving current can be lowered.

DETAILED DESCRIPTION OF INVENTION

The ultraviolet light-emitting diode of the present invention is characterized by having a vertical structure having, on an aluminum polar plane of an n-type AlN single crystal substrate, that is, on a surface of a C-plane (0001), an n-type AlGaN layer, an active layer, a p-type AlGaN layer and a p-type GaN layer in this order, and having the respective electrodes on the p-type GaN layer and on a plane on the opposite side to the aluminum polar plane of the n-type AlN single crystal substrate. Hereinafter, the aluminum polar plane is sometimes referred to as a "main plane" simply, and the plane on the opposite side thereto is sometimes referred to as a "rear plane" simply.

In the ultraviolet light-emitting diode of the present invention, the emission peak wavelength of ultraviolet light emitted from the active layer is in the range of 210 to 300 nm. The ultraviolet light is transmitted by the n-type AlN single crystal substrate and is extracted from the rear plane side of the n-type AlN single crystal substrate. On the rear plane side, an n-electrode is formed, and the ultraviolet light is extracted from a gap in the n-electrode. Hereinafter, of the rear plane from which the ultraviolet light is extracted, a portion where the n-electrode has not been formed is sometimes referred to particularly as a "light-emitting plane", and a portion surrounded by the n-electrode is sometimes referred to as an "opening". These function as light extraction windows. In the present invention, the ultraviolet light-emitting diode is limited to an ultraviolet light-emitting diode having an emission peak wavelength in the range of 210 to 300 nm because the effect of the present invention is remarkably exerted.

Next, a preferred structure of the vertical ultraviolet light-emitting diode of the present invention will be specifically described with reference to FIG. 1 (sectional view) and other drawings.

(n-Type AlN Single Crystal Substrate)

Figure 1:
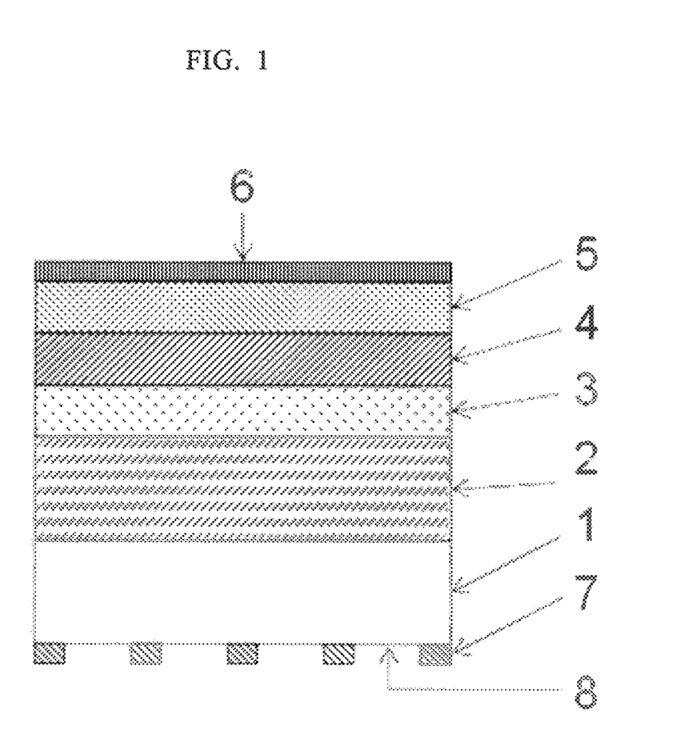
FIG. 1 is a sectional view of a vertical ultraviolet light-emitting diode that is an example of the present invention.

In FIG. 1, the n-type AlN single crystal substrate 1 contains an n-type dopant material in the AlN substrate and has n-type electrical conductivity. The n-type dopant material is not particularly limited, but known dopant materials such as Si, O and S can be used. Of these, Si is preferable taking controllability of the dopant concentration, ionization energy in AlN, etc. into consideration.

The n-type dopant concentration can be appropriately determined so as to obtain desired electrical conductivity, but in general, it is preferably in the range of $1\times10^{18}$ cm$^{-3}$ to $1\times10^{20}$ cm$^{-3}$, and is more preferably in the range of $5\times10^{18}$ cm$^{-3}$ to $5\times10^{19}$ cm$^{-3}$.

Impurities (e.g., C, Mg, Cl) other than the n-type dopant can be a factor of decrease in n-type electrical conductivity by compensating the n-type dopant, and therefore, the concentration of the impurities is preferably a low concentration of not more than $1\times10^{17}$ cm$^{-3}$, and is more preferably not more than $5\times10^{16}$ cm$^{-3}$.

The electrical resistance of the n-type AlN single crystal substrate 1 becomes a series resistance component of the ultraviolet light-emitting diode. Therefore, from the viewpoint of reduction of a driving voltage of the ultraviolet light-emitting diode, the specific resistance of the n-type AlN single crystal substrate 1 is preferably lower. The specific resistance of the n-type AlN single crystal substrate can be adjusted by controlling the aforesaid n-type dopant concentration and concentration of other impurities that become the compensation center. The specific resistance of the n-type AlN single crystal substrate is preferably not more than 300 Ω·cm, more preferably not more than 200 Ω·cm. Lowering the lower limit of the specific resistance is more preferable, but taking industrial production of the n-type AlN single crystal substrate into consideration, the lower limit is 0.1 Ω·cm.

Measurement of the concentration of impurities including dopant materials such as Si can be carried out by a known technique such as secondary ion mass spectrometry (SIMS). The n-type electrical conductivity can be measured by known Hall effect measurement or the like.

In the vertical ultraviolet light-emitting diode of the present invention, ultraviolet light is released outside through the substrate. Therefore, in order to inhibit absorption of the ultraviolet light by the n-type AlN single crystal substrate 1 to thereby obtain high emission output, it is preferable that the transmittance of the n-type AlN single crystal substrate 1 be high in the emission peak wavelength range (210 to 300 nm) as limited by the present invention. Specifically, the absorption coefficient of the n-type AlN single crystal substrate 1 in the emission peak wavelength range as recited in the present invention is preferably not more than 25 cm$^{-1}$, more preferably not more than 15 cm$^{-1}$, most preferably not more than 10 cm$^{-1}$. In order to achieve such excellent ultraviolet transmission property, the concentration of impurities that form an absorption band in the AlN single crystal needs to be reduced, and specifically, the concentration of each of C and O is preferably reduced to not more than $1\times10^{17}$ cm$^{-3}$.

The crystal defect (dislocation) in the n-type AlN single crystal substrate 1 acts as a non-radiative recombination center of carriers to cause a decrease in luminous efficiency, or becomes a current leakage path or an impurity diffusion path to cause lowering of reliability. On that account, the dislocation density of the n-type AlN single crystal substrate 1 is not more than $10^6$ cm$^{-2}$, preferably not more than $10^4$ cm$^{-2}$. A preferred lower limit of the dislocation density is 0 cm$^{-2}$, but taking industrial production into consideration, the lower limit is $10^2$ cm$^{-2}$. Measurement of the dislocation density can be carried out by the observation with a transmission electron microscope (TEM) or the observation of an etch pit density after immersion in an alkaline solution in a simplified manner.

In the present invention, the thickness of the n-type AlN single crystal substrate 1 can be appropriately determined according to the desired use application and design, but taking ease of handling into consideration, the thickness is in the range of 50 to 500 μm. If the thickness of the substrate is less than 50 μm mentioned above, it tends to become difficult to secure self-standing property as a substrate, and in addition, disadvantages such as cracks tend to occur, and as a result, a decrease in production yield is liable to be induced. On the other hand, if the thickness of the substrate exceeds 500 μm, handling becomes easy, but the operating voltage of the light-emitting diode increases because of increase in the series resistance of the AlN substrate, or the absorption of the ultraviolet light by the AlN single crystal substrate increases, and as a result, negative factors such as lowering of luminous efficiency tend to become marked. In order to further enhance the yield and further enhance the properties, the thickness of the n-type AlN single crystal substrate 1 is more preferably in the range of 80 to 200 μm.

The plane orientation of the main plane of the n-type AlN single crystal substrate 1 on which an n-type Al$_x$Ga$_{1-x}$N layer, etc. that form the ultraviolet light-emitting diode are formed is C-plane (aluminum polar plane), and the rear plane that becomes the light extraction plane side is −C-plane (nitrogen polar plane). The main plane of the n-type single crystal substrate 1 may be a plane slightly inclined from the C-plane, and the inclination angle from the C-plane is preferably 0 to 3°, but not particularly limited thereto.

In the present invention, the areas of the main plane (aluminum polar plane) and the rear plane (nitrogen polar plane) of the n-type AlN single crystal substrate 1 are not particularly restricted, and can be appropriately determined according to the intended use. In usual, taking industrial production, use application, etc. into consideration, the area of the n-type AlN single crystal substrate 1 is preferably 0.01 to 10 mm² when the light-emitting diode is processed into one chip.

The n-type AlN single crystal substrate having such properties is described in, for example, the patent document 3. The substrate composed of an n-type AlN single crystal layer can be manufactured by a method in which thick AlN (n-type AlN) is formed by crystal growth on an AlN single crystal seed substrate through a hydride vapor phase epitaxy (HVPE) process and then the seed substrate is removed.

(n-Type $Al_XGa_{1-X}N$ Layer)

In FIG. 1, the layer 2 represented by n-type $Al_XGa_{1-X}N$ (wherein X is a rational number satisfying 0.5≤X≤1.0) (sometimes referred to as an "n-type $Al_XGa_{1-X}N$ layer" simply hereinafter) is a single crystal layer formed on the C-plane (aluminum polar plane) of the n-type AlN single crystal substrate 1. X that is an Al composition ratio is a rational number, and can be appropriately determined in the range of 0.5≤X≤1.0 according to the desired wavelength. The n-type $Al_XGa_{1-X}N$ layer 2 may be a single layer of Al composition in the above composition range, or may be formed from a plurality of layers different in composition, or may be a gradient layer in which the composition varies continuously.

The lattice constant of a-axis of the n-type $Al_XGa_{1-X}N$ layer 2 and that of the AlN single crystal substrate 1 are preferably in the lattice-matched state (the lattice constant of a-axis of the n-type $Al_XGa_{1-X}N$ layer and that of the n-type AlN single crystal substrate are equal to each other). In the present invention, the lattice relaxation ratio of the n-type AlGaN layer 2 is preferably not more than 5%. The lower limit of the lattice relaxation ratio is 0% (the a-axis lattice constants of the n-type $Al_XGa_{1-X}N$ layer and the n-type AlN single crystal substrate completely agree with each other). The lattice constants and the lattice relaxation ratios of the n-type $Al_XGa_{1-X}N$ layer 2 and the n-type AlN single crystal substrate 1 can be calculated by measuring the lattice constant of each layer through X-ray reciprocal lattice mapping measurement. The thickness of the n-type $Al_XGa_{1-X}N$ layer 2 can be freely designed in the range in which the aforesaid lattice relaxation ratio is satisfied, but in usual, it is 0.1 to 2.0 μm. The thickness is preferably 0.1 to 1 μm for the reason that in the vertical ultraviolet light-emitting diode of the present invention, with increase in the thickness of the n-type $Al_XGa_{1-X}N$ layer 2, the series resistance of the light-emitting diode increases, or the productivity decreases, in principle. When the n-type $Al_XGa_{1-X}N$ layer 2 is composed of a plurality of layers, the lattice relaxation ratio of each layer is preferably not more than 5%, and the total thickness of all the layers is preferably 0.1 to 2.0 μm.

The n-type $Al_XGa_{1-X}N$ layer 2 is a layer in which crystals are doped with known n-type dopant materials such as Si, O and Ge. Of these, Si is preferable as the doping material used for the same reason as that for the n-type AlN single crystal substrate. The n-type dopant concentration can be appropriately determined so as to obtain desired electrical conductivity, but it is preferably in the range of $1 \times 10^{18}$ cm⁻³ to $1 \times 10^{20}$ cm⁻³.

Such an n-type $Al_XGa_{1-X}N$ layer 2 can grow through known crystal growth methods such as a metal organic chemical vapor phase deposition (MOCVD) method and a molecular beam epitaxy (MBE) method. Of these, preferable is the MOCVD method that has high productivity and is industrially widely used. When the MOCVD method is adopted, the n-type $Al_XGa_{1-X}N$ layer 2 can be formed by a method similar to the method described in, for example, the patent document 3.

(Active Layer)

In FIG. 1, the active layer 3 is formed on the n-type $Al_XGa_{1-X}N$ layer 2, and is preferably composed of a single crystal layer represented by a composition formula $Al_ZGa_{1-Z}N$ (wherein Z is a rational number satisfying 0.0≤Z≤1.0) (sometimes referred to as an "$Al_ZGa_{1-Z}N$ layer" simply hereinafter). Specifically, a quantum well structure in which a quantum well layer formed of the $Al_ZGa_{1-Z}N$ layer and a barrier layer are combined is preferable. This quantum well structure can be a single quantum well layer structure or can be a multiquantum well structure composed of a plurality of quantum well layers. The thickness of the quantum well layer is not particularly limited, but from the viewpoints of enhancement of luminous efficiency and reliability, it is preferably 1.5 to 10 nm. Also the thickness of the barrier layer is not particularly limited, but it is generally in the range of 5 to 30 nm. The number of layers of the quantum well is not particularly limited, but in order to stably obtain higher output, three layers or more are preferable.

The Al composition ratios and the thicknesses of the quantum well layer and the barrier layer can be appropriately determined so as to obtain a desired emission peak wavelength.

For the purpose of enhancing luminous efficiency, the quantum well layer and the barrier layer can also be doped with impurities.

The lattice constant of a-axis of the active layer 3 and that of the n-type AlN single crystal substrate 1 are preferably in the lattice-matched state, and in the present invention, the lattice relaxation ratio is preferably not more than 5%.

The active layer 3 is preferably produced by the MOCVD method similarly to the n-type $Al_XGa_{1-X}N$ layer 2. In this case, the active layer 3 can be formed by a similar method described in, for example, Japanese Unexamined Patent Application Publication No. 2014-241397.

(p-Type $Al_YGa_{1-Y}N$ Layer)

In FIG. 1, the layer 4 represented by p-type $Al_YGa_{1-Y}N$ (wherein Y is a rational number satisfying 0.5≤X≤1.0) (sometimes referred to as a "p-type $Al_YGa_{1-Y}N$ layer" simply hereinafter) is a single crystal layer formed on the active layer 3. Y that is an Al composition ratio is a rational number, and can be appropriately determined in the range of 0.5≤X≤1.0 according to the desired emission peak wavelength. The p-type $Al_YGa_{1-Y}N$ layer 4 may be a single layer of Al composition in the above composition range, or may be formed from a plurality of layers different in composition, or may be a gradient layer in which the composition varies continuously. In order to effectively inhibit leakage of electrons in the p-type $Al_YGa_{1-Y}N$ layer, it is preferable to adopt a layered structure of p-type AlN (Y=1.0) layer/p-type AlGaN (0.5≤Y≤1.0) layer.

The lattice constant of a-axis of the p-type $Al_YGa_{1-Y}N$ layer 4 and that of the n-type AlN single crystal substrate 1 are preferably in the lattice-matched state similarly to the n-type $Al_XGa_{1-X}N$ layer 2 and the active layer 3, and also the lattice relaxation ratio is preferably not more than 5%. The thickness of the p-type $Al_YGa_{1-Y}N$ layer 4 can be appropriately determined according to the design of the light-emitting diode, but it is preferably 5 to 100 nm.

When the p-type $Al_YGa_{1-Y}N$ layer 4 is composed of a plurality of layers, the lattice relaxation ratio of each layer is preferably not more than 5%, and the total thickness of all the layers is preferably 5 to 100 nm.

The p-type Al$_y$Ga$_{1-y}$N layer 4 is a single crystal layer imparted with p-type electrical conductivity by incorporating a known p-type dopant material such as Mg, Be or C into the crystals. As the p-type dopant material used, Mg having small ionization energy is preferably used. The p-type dopant concentration can be appropriately determined so as to obtain desired electrical conductivity, but it is preferably in the range of 1×10$^{18}$ cm$^{-3}$ to 1×10$^{20}$ cm$^{-3}$.

The p-type Al$_y$Ga$_{1-y}$N layer 4 is preferably produced by the MOCVD method similarly to the n-type Al$_x$Ga$_{1-x}$N layer 2 and the active layer 3. When the p-type Al$_y$Ga$_{1-y}$N layer 4 is formed by the MOCVD method, the p-type Al$_y$Ga$_{1-y}$N layer 4 can be formed by a similar method described in, for example, Japanese Unexamined Patent Application Publication No. 2014-241397.

(p-Type GaN Layer)

In FIG. 1, the p-type GaN layer 5 is a single crystal layer formed on the p-type Al$_y$Ga$_{1-y}$N layer 4 and becomes a layer that comes into contact with the p-electrode 7 formed on the p-type GaN layer 5. As a p-type dopant of the p-type GaN layer 5, Mg is preferably used similarly to the p-type Al$_y$Ga$_{1-y}$N layer 4. The p-type dopant concentration in the p-type GaN layer 5 can be appropriately determined, but from the viewpoint that reduction of the contact resistance between this layer and the p-type electrode is facilitated, the concentration is preferably 5×10$^{19}$ to 5×10$^{20}$ cm$^{-3}$. In the p-type GaN layer 5, the dopant concentration may be kept constant, or concentration gradient may be present inside the layer.

The thickness of the p-type GaN layer 5 is not particularly limited, but it is preferably 5 to 400 nm. Since the thickness of the p-type GaN layer satisfies this range, an increase in the contact resistance between this layer and the p-electrode can be inhibited, and prolongation of the growth time of the p-type GaN layer can be prevented. The p-type GaN layer is preferably produced by the MOCVD method similarly to other layers, and can be formed by a similar method described in, for example, Japanese Patent No. 5401145.

(p-Electrode)

In FIG. 1, a material of the p-electrode 6 formed on the p-type GaN layer 5 is not particularly restricted as long as the material can reduce the contact resistance between the p-electrode and the p-type GaN layer 5, and a known p-type ohmic electrode material can be used. Specifically, for example, electrode materials containing Ni or Au described in Japanese Patent No. 3499385 and electrode materials, such as Pd, Pt and ITO, described in Japanese Unexamined Patent Application Publication No. 2004-327980 can be used. The p-electrode 6 may contain Al for the purpose of reflecting ultraviolet light having been generated in the active layer, toward the n-type AlN single crystal substrate side.

The p-electrode 6 may be formed on the whole surface of the p-type GaN layer 5, or can be formed in the form of mesh. In order to reduce the resistance value between the p-electrode 6 and the p-type GaN layer 5, it is preferable to increase the contact area. However, the aforesaid p-type ohmic electrode materials generally have low ultraviolet light reflectance. On that account, for the purpose of increasing the amount of reflected ultraviolet light directed toward the substrate side, it is preferable to adopt a structure in which the p-electrode in the form of mesh is combined with an Al reflecting electrode, or the like.

These electrode materials can be formed by a vacuum deposition method, a sputtering method, or the like. After the p-electrode is formed, this electrode is preferably subjected to annealing treatment in an atmosphere of nitrogen, oxygen or the like for the purpose of reducing the contact resistance value. Although the annealing temperature is not particularly restricted, it is generally about 400 to 700° C. Although the thickness of the p-electrode 6 is not particularly restricted, it is preferably 1 to 300 nm.

(n-Electrode)

In FIG. 1, the n-electrode 7 is formed on the rear plane (nitrogen polar plane) side opposite to the main plane of the n-type AlN single crystal substrate. Of the rear plane, a portion where no n-electrode is formed functions as a light-emitting plane, and in a preferred embodiment, an opening functioning as a light extraction window is provided. In FIG. 2, FIG. 3, FIG. 4 and FIG. 5, shapes of n-electrodes seen from a side where light is extracted are shown. FIG. 3, FIG. 4 and FIG. 5 show examples in which the n-electrode forms an opening 8 (light extraction window).

Figure 2:
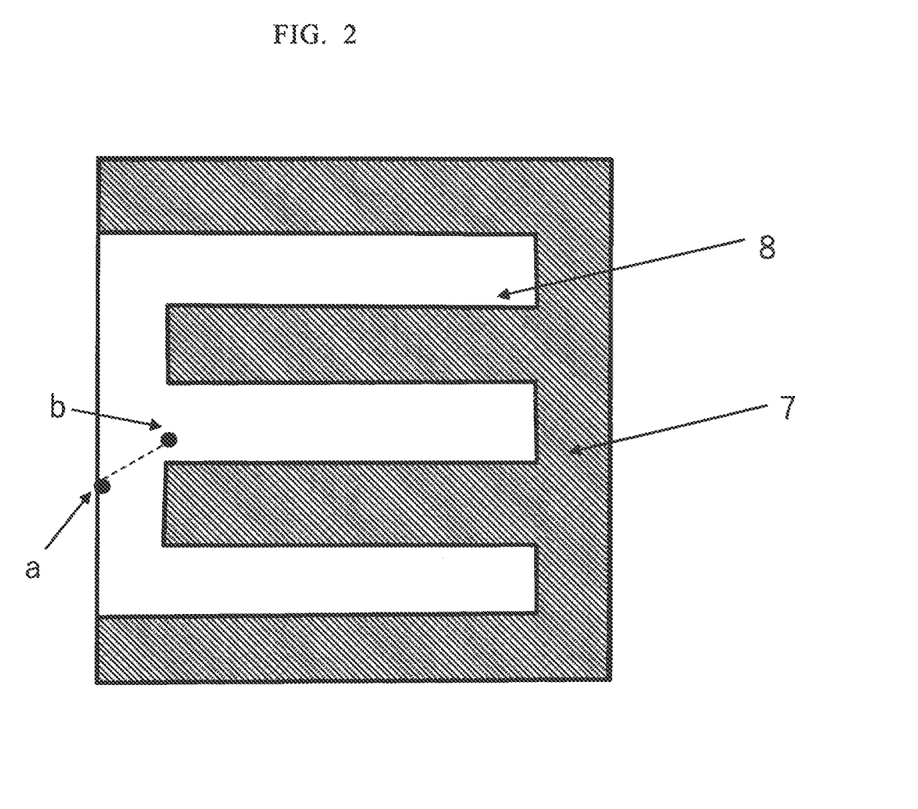
FIG. 2 shows an example of a pattern of an n-electrode formed in the first invention.
Figure 3:
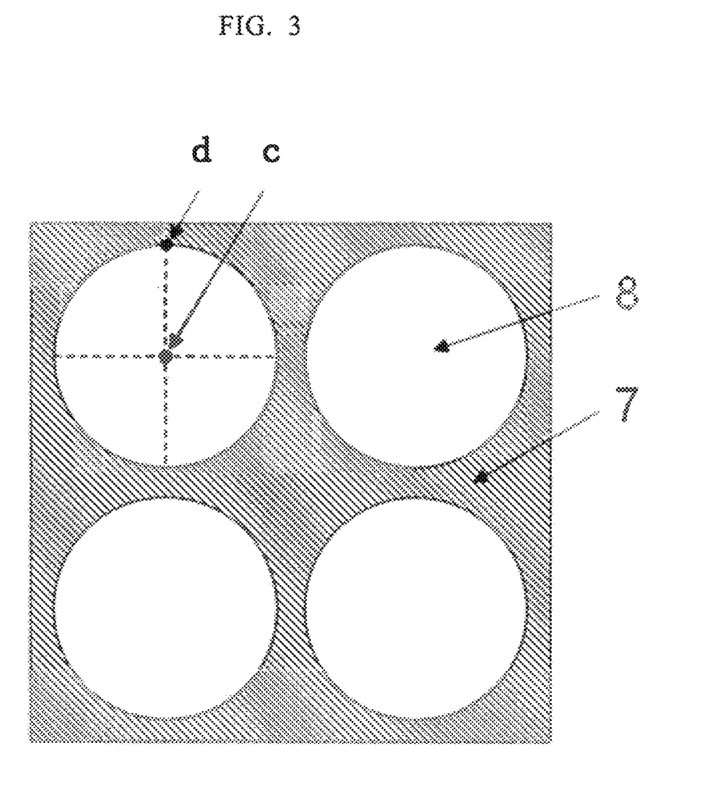
FIG. 3 shows an example of an opening (light extraction window) formed by an n-electrode in the second invention.
Figure 4:
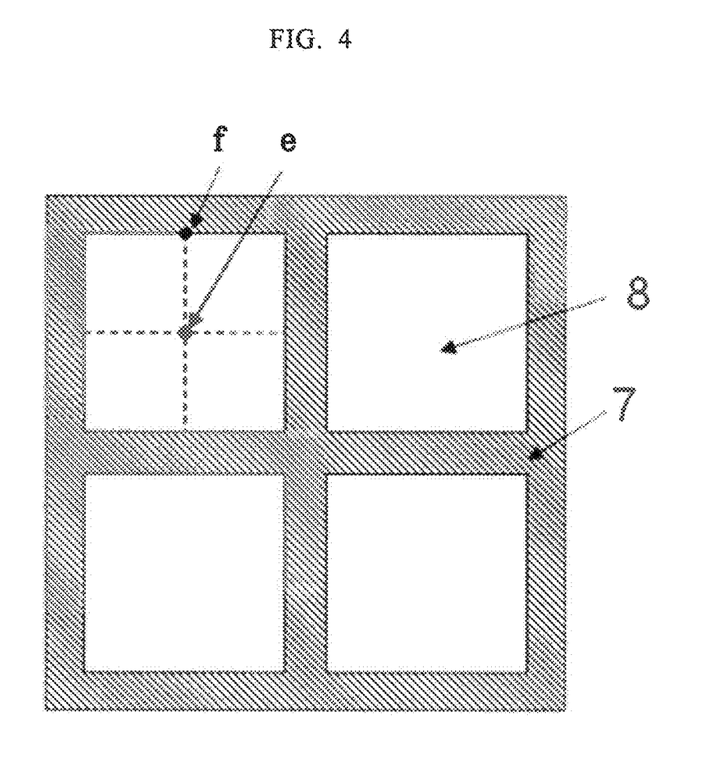
FIG. 4 shows an example of an opening (light extraction window) formed by an n-electrode in the second invention.
Figure 5:
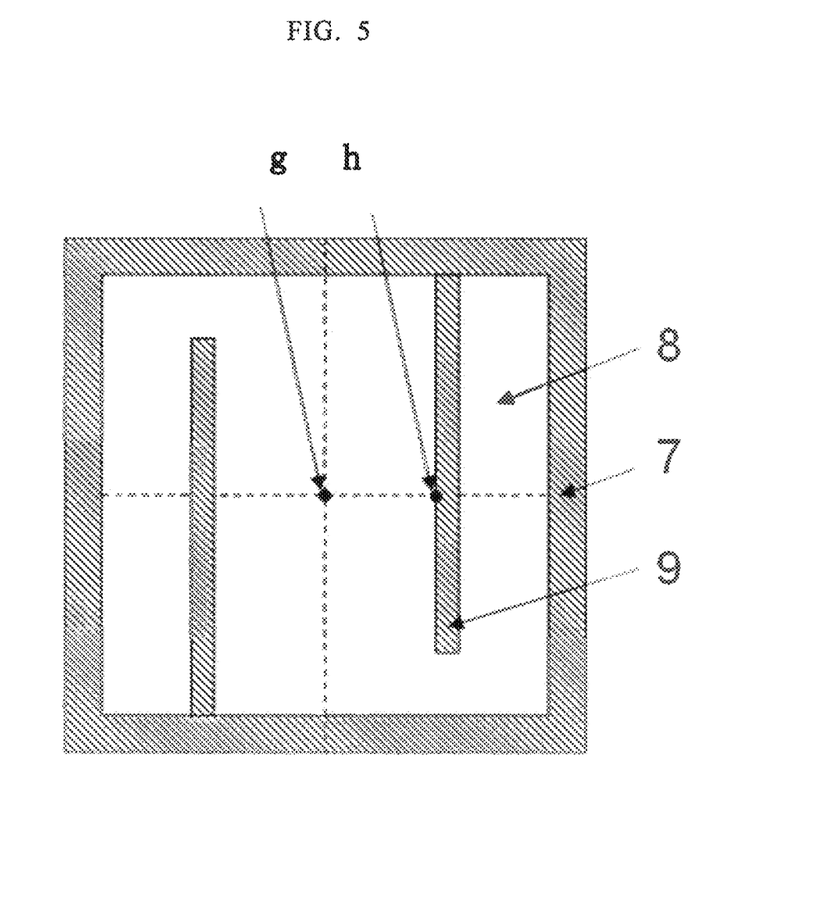
FIG. 5 shows an example of an opening (light extraction window) formed by an n-electrode in the second invention.

The shape of the n-electrode is not particularly limited, and may be a comb-like shape as shown in FIG. 2, or may be a shape having an opening 8 (light extraction window) of a circle, a quadrangle or the like by the n-electrode, as shown in FIG. 3 and FIG. 4. Of these, a shape enabling isotropic current injection to the utmost, such as circle, is preferable from the viewpoint of suppression of ununiformity of emission output and current density.

In the present invention, the shortest distance between an edge of the n-electrode and an arbitrary point in a portion where the n-electrode is not formed (namely, a light-emitting plane or an opening, this portion being collectively referred to as an "opening" simply hereinafter) must be not more than 400 µm. That is to say, the distance between a point (position) among all points (positions) in the opening and an edge of the n-electrode, the edge being at the closest position to the point (position), must be not more than 400 µm. In other words, the distance between a certain point in the opening and an edge of the n-electrode at the closest position to the point is measured, then a combination having the longest distance between them is found, and the longest distance among the combination must be not more than 400 µm. Naturally, the edge of the n-electrode is an edge on the side that is in contact with the opening.

For example, in the case where the n-electrode is comb-shaped as shown in FIG. 2, the longest distance between a point in the opening 8 and the n-electrode is a distance of a-b, and this distance of a-b must be not more than 400 µm. In the case where the opening is such a circle as in FIG. 3, if the distance between the center c of the opening 8 and the edge d of the n-electrode (distance of c-d), namely, a radius of the opening 8, is not more than 400 µm, the shortest distance between the edge of the electrode and an arbitrary point in the opening becomes not more than 400 µm. In the case where the opening 8 is such a quadrangle as in FIG. 4, when considering a point f at which an imaginary straight line from the center e of the opening and a side of the n-electrode 7 cross at right angles, if the distance of a combination having a distance between the center e of the opening 8 and the point f (distance of e-f) that is longer than other combinations is not more than 400 µm, the shortest distance between the edge of the electrode and an arbitrary point in the opening becomes not more than 400 µm (in the case of a square, the distance between the center e of the opening 8 and the point f at which the imaginary straight line from the center e and a side of the n-electrode cross at right angles is naturally equal in any side). As a modified embodiment, in the case where a linear n-electrode 9 is provided in a quadrangular opening 8 as shown in FIG. 5, the longest distance between an edge h of the n-electrode that is at the closest position and a point in the opening 8, closest each other, is a distance of g-h, and this distance of g-h must be not more than 400 µm.

The shortest distance between the edge of the n-electrode and an arbitrary point in the opening must be not more than 400 µm. If the shortest distance exceeds 400 µm (if the opening of the n-electrode 7 becomes larger), the carriers cannot reach the center of the opening, and there occurs a phenomenon that the emission intensity decreases at the center of the opening and emission takes place in a portion near the n-electrode, namely, only at the outer periphery of the opening. In this case, the distribution of the current density in the crystals becomes large, and as a result, disadvantages such as lowering of reliability of the element are liable to occur. By designing the shortest distance to not more than 400 µm, difference of current density in the opening is reduced, and as a result, the emission intensity in the opening can be made uniform. If the shortest distance is too small, the emission area in the light-emitting diode chip is relatively decreased, and the emission intensity is sometimes lowered. On that account, the lower limit of the shortest distance is preferably 30 µm. Taking the emission intensity and the uniformity thereof into consideration, the shortest distance is preferably 50 to 400 µm, more preferably 50 to 300 µm. Taking the isotropy of current and the uniformity of emission into consideration, it is particularly preferable that the opening 8 be surrounded by the n-electrode, as shown in FIG. 3 to FIG. 5.

In the present invention, the number of the openings 8 may be one as long as the shortest distance is satisfied, but from the viewpoint of emission intensity, a plurality of openings are preferably present on the rear plane of the n-type AlN single crystal substrate 1. The number of the openings 8 can be appropriately determined according to the length of the shortest distance, the size of the n-type AlN single crystal substrate 1 (area of the rear plane of the n-type AlN single crystal substrate 1), etc. Above all, it is preferable to provide a plurality of the openings 8 in such a way that the total area (whole area) of the openings 8 becomes not less than 40%, preferably not less than 50%, of the area of the rear plane of the n-type AlN single crystal substrate 1 after processing into a shape of a light-emitting diode chip. The upper limit of the total area of the openings 8 is 90% of the area of the rear plane of the n-type AlN single crystal substrate 1 after processing into a shape of a light-emitting diode chip. As previously described, the area of the rear plane of the n-type AlN single crystal substrate 1 in one chip is preferably 0.01 to 10 $mm^2$, and in this case, the total area of the openings 8 is preferably 0.004 to 9 $mm^2$.

In the present invention, for the n-electrode 7, a known n-type ohmic electrode material and a known formation method can be used. Specifically, the material is not particularly limited as long as it is a material capable of reducing the contact resistance value between the electrode and the n-type AlN single crystal substrate 1. More specifically, electrode materials containing Ti and Al described in Japanese Unexamined Patent Application Publication No. 2011-547604 are preferably used. Using these electrode materials, the n-electrode 7 is formed on the n-type AlN single crystal substrate 1 by a vacuum deposition method or a sputtering method. The n-electrode 7 may be formed of a multilayer metallic membrane. After the n-electrode 7 is formed, the n-electrode 7 is preferably subjected to annealing in an atmosphere of an inert gas such as argon or nitrogen in order to reduce the contact resistance value. The annealing temperature is not particularly restricted, but it is preferably 700 to 1100° C. The thickness of the n-electrode (layer) is not particularly restricted, and the thickness of each layer can be appropriately determined in a range in which the contact resistance value after annealing can be reduced. Taking productivity of the electrode layer, etc. into consideration, the total thickness is preferably 50 to 500 nm.

(About Rear Plane where n-Electrode 7 is Formed)

In the present invention, it is preferable that on the rear plane of the n-type AlN single crystal substrate 1 on which the n-electrode is to be formed, the thickness of a damage layer caused by mechanical polishing or the like be not more than 50 nm. The thickness of this damage layer is usually a thickness of a layer in which fluctuation or dislocation of the crystal structure occurs, and is confirmed by contrast difference in the image of a transmission electron microscope (TEM) of 100000 to 1000000 magnifications. Naturally, the thickness of the damage layer is a thickness in the depth direction of the n-type AlN single crystal substrate 1 from the nitrogen polar plane.

The presence of the damage layer attributable to mechanical polishing or the like on the surface of the nitrogen polar plane of the n-type AlN single crystal substrate 1, on which the n-electrode is formed, becomes a factor of increase in the contact resistance between the n-electrode 7 and the n-type AlN single crystal substrate 1. On that account, the thickness of the damage layer is preferably not more than 50 nm, more preferably not more than 10 nm. The lower limit of the thickness of the damage layer is naturally 0 nm.

It is known that when a group III nitride substrate surface is subjected to mechanical polishing, a damage layer with a depth of not less than several tens nm is formed (See, for example, *Journal of Applied Physics*, 113, 123508 (2013)). In order to reduce the thickness of the damage layer to not more than 50 nm, CMP (Chemical Mechanical Polishing) can be carried out. In general, CMP is carried out for the purpose of removing a surface damage layer on the crystal growth plane, but the present inventors have found that it is effective for the improvement of electrode property to carry out the same CMP also on the nitrogen polar plane (plane for electrode formation) side that is the opposite side to the crystal growth plane.

In the present invention, for removing the damage layer by CMP, an alkaline polishing agent that is usually used as a CMP agent for group III nitrides can be used. However, scratches cannot be removed by etching with the polishing agent in some cases, and therefore, a neutral or acid polishing agent is preferably used. The size of abrasive grains used for the CMP is not particularly limited, but abrasive grains of about 20 to 100 nm are preferable used. By carrying out CMP of the nitrogen polar plane of the n-type AlN single crystal substrate 1 under such conditions, the thickness of the damage layer can be reduced to not more than 50 nm.

In the present invention, the n-electrode 7 is formed on −C-plane (000-1, nitrogen polar plane (rear plane)) that is parallel with the crystal growth plane (C-plane, aluminum polar plane (main plane)). In the present invention, on this nitrogen polar plane, the n-electrode 7 can be directly formed. In another embodiment of the present invention, at least a part of the rear plane on which the n-electrode 7 is to be formed can be a semipolar plane. By using the semipolar plane having been inclined to the A-plane (11-20) or the M-plane (1-100) side from the −C-plane as the crystal plane on which the n-electrode is to be formed, the electrode resistance can be reduced. Specifically, the shape of the exposed semipolar plane becomes a pyramid formed of the semipolar plane. The plane orientation of the semipolar plane is not particularly limited, but taking chemical stability of the shape, etc. into consideration, a semipolar plane wherein the M-plane (1-100) is inclined, such as (1-102) or (1-101), is preferably used, and of there, (1-101) is preferable. The reason why the electrode resistance between the n-electrode 7 and the n-type AlN single crystal substrate 1 can be reduced by forming the n-electrode 7 on the semipolar plane is not necessarily clear, but the present inventors consider that there are the following possibilities. That is to say, it is thought that 1) although the contact resistance between the n-electrode 7 and the n-type AlN single crystal substrate 1 does not vary, the contact area of the electrode increases, and as a result, the electrode resistance is reduced, and 2) since the energy barrier between the n-electrode 7 and the n-type AlN single crystal substrate 1 decreases on the semipolar plane as compared with the –C-plane, the contact resistance decreases, and as a result, the electrode resistance is reduced.

Such a semipolar plane can be formed by subjecting the –C-plane (nitrogen polar plane) of the n-type AlN single crystal substrate 1 to known photolithography or nano imprinting to form a predetermined pattern and then carrying out ICP (Inductive Coupled Plasma) dry etching. Alternatively, the semipolar plane can also be formed by immersing the n-type AlN single crystal substrate 1 in an alkaline solution to carry out etching of the nitrogen polar plane of the n-type AlN single crystal substrate 1. When the ICP dry etching is carried out, a known etching gas such as $Cl_2$, $BCl_3$ or $CHF_3$ can be used as the etching gas. After the ICP dry etching, depressions and protrusions in the form of corns are only formed on the rear plane surface of the n-type AlN single crystal substrate 1, and such a semipolar plane wherein the M-plane has been inclined as previously described is not formed in some cases. Therefore, for the purpose of exposing the semipolar plane and for the purpose of removing damages formed on the ICP dry-etched surface, it is preferable to carry out immersion etching treatment using an alkaline solution or a solution of hydrochloride acid or the like after the ICP dry etching. The conditions of this immersion etching treatment can be appropriately determined, and for example, when hydrochloric acid is used, immersion in a 20% hydrochloric acid solution having been heated to 40° C. can be carried out for about 30 minutes. Examples of the alkaline aqueous solutions employable herein include known alkaline solutions, such as potassium hydroxide (KOH) aqueous solution, sodium hydroxide (NaOH) aqueous solution, calcium hydroxide (Ca (OH)$_2$) aqueous solution, sodium carbonate ($Na_2CO_3$) aqueous solution and tetramethylammonium hydroxide (TMAH).

On the other hand, when the etching treatment with an alkaline solution is carried out, the etching conditions are not particularly limited, and they can be appropriately determined so as to obtain a desired shape. As the alkaline solution, the same alkaline solution as the above-mentioned known alkaline solution can be used. Also the temperature, the immersion time, etc. are not particularly limited, but for example, when a 10% KOH aqueous solution is used, the etching temperature and the etching time can be appropriately determined in the ranges of 40 to 100° C. and 2 to 10 min, respectively.

In the present invention, the plane orientation of the semipolar plane can be roughly found by measuring angles of a depression and a protrusion in the horizontal direction and in the vertical direction. The semipolar plane may be present at least at a portion where the n-electrode is to be formed, but if the n-electrode is formed on a semipolar plane, the whole of the rear plane of the single crystal AlN substrate 1 is preferably a semipolar plane taking productivity into consideration. By making the whole of the rear plane into a semipolar plane, the light extraction efficiency can be enhanced.

EXAMPLES

The present invention is specifically described with reference to the examples in each of which a vertical ultraviolet light-emitting diode having an emission wavelength of 260 nm has been manufactured, but the present invention is in no way limited to the following examples.

Example 1

(Preparation of n-Type AlN Single Crystal Substrate 1)

The n-type AlN single crystal substrate was manufactured by the method described in Applied Physics Express 8 (2015) 061003. Specifically, a C-plane AlN seed substrate having a diameter of 25 mm made by a PVT method (sublimation method) was prepared first. This AlN seed substrate had an off-angle of 0.05 to 0.3° and a dislocation density of not more than $10^4$ cm$^{-2}$. The AlN seed substrate used had high resistance (specific resistance value: 10 TΩ·cm).

Next, on the AlN seed substrate, an n-type AlN thick membrane (referred to as a "HVPE process n-type AlN thick membrane" hereinafter) having a thickness of 300 μm was formed by a HVPE process, and thereafter, CMP of the grown plane of the HVPE process n-type AlN thick membrane was carried out. From X-ray rocking curve measurement, it was confirmed that the HPVE process AlN thick membrane after CMP kept a dislocation density of not more than $10^4$ cm$^{-2}$ similarly to the AlN seed crystal. As the dopant, Si was used.

The off-angle of the HVPE process n-type AlN thick membrane after CMP was controlled to 0.2 to 0.5°. The surface roughness (RMS) of the crystal growth plane (polished plane of the HVPE process n-type AlN thick membrane) of the growth substrate (substrate having the HVPE process n-type AlN thick membrane formed on the AlN seed substrate) manufactured as above was not more than 0.1 nm in the range of 5×5 μm$^2$.

After an AlN seed substrate portion of a growth substrate manufactured in the same manner as above was removed by mechanical polishing, measurement of a transmittance of the HVPE process n-type AlN thick membrane (thickness: 100 μm) was carried out. As a result, it was confirmed that the linear transmittance at 260 nm was not less than 63% and the absorption coefficient at the same wavelength was not more than 10 cm$^{-1}$. In the HVPE process AlN thick membrane (thickness: 100 μm), Si was contained in an amount of $2×10^{18}$ cm$^{-3}$, the specific resistance was 160 Ω·cm, and the concentration of each of C and O was not more than $1×10^{17}$ cm$^{-3}$.

When a vertical ultraviolet light-emitting element is manufactured, the AlN seed substrate portion is finally removed from this growth substrate, though details thereof will be described below. On that account, the HVPE process n-type AlN thick membrane portion corresponds to the n-type single crystal AlN substrate in the present invention.

(Growth of n-Type $Al_xGa_{1-x}N$ Layer 2)

The growth substrate manufactured as above was placed on a susceptor in an MOCVD apparatus, and while allowing a mixed gas of hydrogen and nitrogen to flow at a total flow rate of 13 slm, the substrate was heated up to 1200° C., thereby carrying out cleaning of the crystal growth plane. Subsequently, an n-type $Al_{0.7}Ga_{0.3}N$ layer was formed in a thickness of 1.0 μm under the conditions of a substrate temperature of 1050° C., a trimethylaluminum flow rate of 35 μmol/min, a trimethylgallium flow rate of 18 μmol/min, a tetraethylsilane flow rate of 0.02 μmol/min and an ammonia flow rate of 1.5 slm. The amount of Si contained in the n-type $Al_{0.7}Ga_{0.3}N$ layer formed under the same conditions was $9\times10^{18}$ $cm^{-3}$.

(Growth of Active Layer 3)

Subsequently, a barrier layer was formed in a thickness of 10 nm under the same conditions as those for the n-type $Al_{0.7}Ga_{0.3}N$ layer, except that the tetraethylsilane flow rate was changed to 0.002 μmol/min. Subsequently, an $Al_{0.5}Ga_{0.5}N$ well layer was formed in a thickness of 3 nm under the same conditions as those for the n-type $Al_{0.7}Ga_{0.3}N$ layer, except that the trimethylgallium flow rate was changed to 40 μm/min, the trimethylaluminum flow rate was changed to 3 μmol/min, and the tetraethylsilane flow rate was changed to 0 μmol/min. By repeating growth of the well layer and the barrier layer 3 times, a triple quantum well layer (active layer) was formed. The amount of Si contained in a barrier layer formed under the same conditions was $1\times10^{18}$ $cm^{-3}$.

(Growth of p-Type $Al_yGa_{1-y}N$ Layer 4)

Subsequently, a p-type AlN layer was formed in a thickness of 20 nm under the same conditions as those for the n-type $Al_{0.7}Ga_{0.3}N$ layer, except that feeding of trimethylgallium and tetraethylsilane was stopped, and biscyclopentadienylmagnesium was fed at a rate of 1.0 μmol/min. The amount of Mg contained in a p-type AlN layer formed under the same conditions was $5\times10^{19}$ $cm^{-3}$.

Subsequently, a p-type $Al_{0.8}Ga_{0.2}N$ layer was formed in a thickness of 30 nm under the same conditions as those for the p-type AlN layer, except that trimethylgallium was fed at a flow rate of 8 μmol/min. The amount of Mg contained in a p-type $Al_{0.8}Ga_{0.2}N$ layer formed under the same conditions was $6\times10^{19}$ $cm^{-3}$.

(Growth of p-Type GaN Layer 5)

Subsequently, the substrate temperature was changed to 1030° C. and the pressure was changed to 200 mbar, and thereafter, a p-type GaN layer was formed in a thickness of 200 nm under the conditions of a trimethylgallium flow rate of 0.2 μmol/min, an ammonia flow rate of 3.0 slm, a biscyclopentadienylmagnesium flow rate of 1.0 μmol/min, and a carrier gas flow rate of 7 slm (nitrogen mixing ratio: 0.4). The amount of Mg contained in the p-type GaN layer was $7\times10^{19}$ $cm^{-3}$.

(Characteristics of n-Type $Al_XGa_{1-X}N$ Layer to p-Type GaN Layer)

The substrate having grown up to the p-type GaN layer was taken out of the MOCVD apparatus, and the crystal quality was evaluated by a high-resolution X-ray diffractometer similarly to the AlN substrate. In order to evaluate the state of lattice relaxation of each layer, XRD reciprocal lattice mapping measurement of the (114) plane was carried out, and as a result, the lattice relation ratios of the AlGaN layers (n-type AlGaN layer, active layer, p-type AlGaN layer) were each not more than 1.0%, and the lattice relaxation ratio of the p-type GaN layer was 71.2%.

(Exposure of Rear Plane of n-Type AlN Single Crystal Substrate 1)

Figure 6:
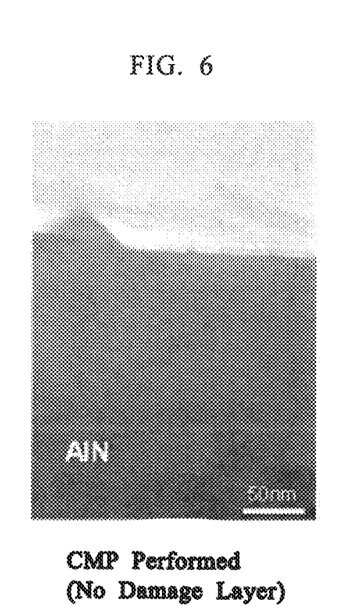
FIG. 6 is a transmission electron micrograph showing a case where no damage layer (less than 10 nm) is present in a plane on which an n-electrode is formed.
Figure 7:
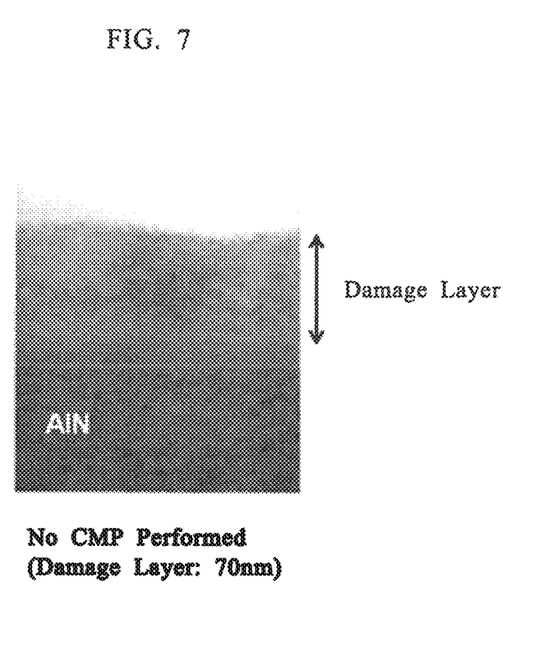
FIG. 7 is a transmission electron micrograph showing a case where a damage layer (approx. 70 nm) is present in a plane on which an n-electrode is formed.

Subsequently, the AlN seed substrate was removed by mechanical polishing until the nitrogen polar plane of the HVPE process n-type AlN thick membrane was exposed. Thereafter, a damage layer of the nitrogen polar plane of the HVPE process n-type AlN single crystal substrate was removed by CMP. The thickness of the n-type AlN single crystal thick membrane (substrate) remaining after the polishing was 109 μm. A sectional TEM image of a nitrogen polar plane of an n-type AlN single crystal substrate having been likewise manufactured by carrying out CMP is shown in FIG. 6, and a sectional TEM image of a nitrogen polar plane of an n-type AlN single crystal substrate having been manufactured by carrying out only mechanical polishing without carrying out CMP is shown in FIG. 7. In the case of mechanical polishing only, the thickness (depth) of the damage layer from the surface was about 70 nm, but in contrast, in the case where CMP was carried out, it was less than 10 nm.

(Formation of n-Electrode 7 (Formation of Opening 8))

Subsequently, on the nitrogen polar plane side (rear plane) of the n-type AlN single crystal substrate, an n-electrode (Ti (10 nm)/Al (200 nm)/Ti (5 nm)) having been provided with such a plurality of circular openings (shortest distance: 250 μm) each having a diameter of 500 μm as shown in FIG. 3 was formed by a vacuum deposition method, and was subjected to heat treatment in a nitrogen atmosphere under the conditions of 1 minute and 800° C.

(Formation of p-Electrode 6)

Subsequently, on the p-type GaN layer, a p-electrode (Ni (20 nm)/Au (50 nm)) was formed by a vacuum deposition method, and was subjected to heat treatment in a nitrogen atmosphere under the conditions of 5 minutes and 500° C.

Subsequently, on each of the n-electrode and the p-electrode after the heat treatment, a pad electrode (Ti (10 nm)/Ni (300 nm)/Au (300 nm)) was formed, thereby completing a vertical ultraviolet light-emitting diode wafer (in this case, the HVPE process n-type AlN thick membrane portion corresponded to the n-type AlN single crystal substrate).

(Properties of Vertical Ultraviolet Light-Emitting Diode)

The manufactured vertical light-emitting diode wafer was cut into a plurality of chips of 1.8×1.8 mm by dicing, and then they were mounted on a ceramic substrate to complete a vertical light-emitting diode. The area of the rear plane of the n-type AlN single crystal substrate was 3.24 $mm^2$, the area of all the openings was 1.77 $mm^2$ (number of openings: 9), and the proportion of the openings to the rear plane area of the chip was 55%. The emission wavelength of the manufactured vertical light-emitting diode was 260 nm, and the operating voltage at a driving current of 100 mA was 37 V. The emission intensity distribution (minimum light intensity/maximum light intensity) on the light-emitting plane, as estimated from a near-field image of the light-emitting diode, was 0.81. These results are summarized in Table 1.

Example 2

A vertical light-emitting diode was manufactured in the same manner as in Example 1, except that in the formation of an n-electrode of Example 1, the diameter of the opening was changed to 300 μm (shortest distance: 150 μm). The area of all the openings was 1.77 $mm^2$ (number of openings: 25), and the proportion of the openings to the rear plane area of the chip was 55%.

The emission wavelength of the manufactured vertical light-emitting diode was 260 nm, and the operating voltage at a driving current of 100 mA was 35 V. The emission intensity distribution (minimum light intensity/maximum light intensity) on the light-emitting plane, as estimated from a near-field image of the light-emitting diode, was 0.87. These results are summarized in Table 1.

Example 3

Figure 8:
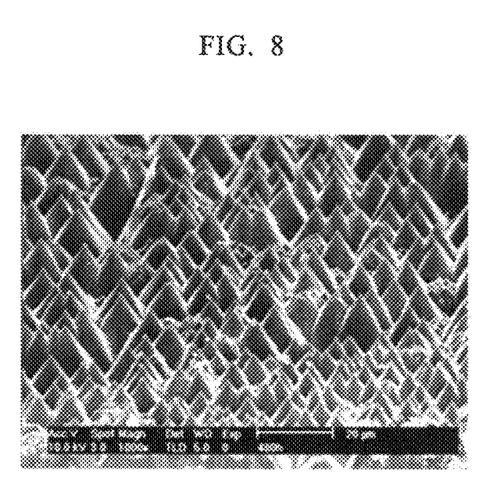
FIG. 8 is an electron micrograph showing a state where a portion on which an n-electrode is formed has become a semipolar plane in the third invention.

A vertical light-emitting diode was manufactured in the same manner as in Example 1, except that in the exposure of the rear plane of the n-type AlN single crystal substrate of Example 1, immersion in a 10% KOH aqueous solution was carried out under the conditions of 100° C. and 5 minutes after the CMP of the nitrogen polar plane of the HVPE process n-type AlN substrate. The area of all the openings was 1.77 mm$^2$ (number of openings: 9), and the proportion of the openings to the rear plane area of the chip was 55%. An electron micrograph of the opening is shown in FIG. 8. It was confirmed that on the whole of the n-type AlN single crystal plane, hexagonal pyramids were formed, and the plane angle between the horizontal plane and the hexagonal pyramid was 60 to 63°, and this angle was almost equal to that of the (1-101) plane of AlN.

The emission wavelength of the manufactured vertical light-emitting diode was 260 nm, and the operating voltage at a driving current of 100 mA was 23 V. The emission intensity distribution (minimum light intensity/maximum light intensity) on the light-emitting plane, as estimated from a near-field image of the light-emitting diode, was 0.80. These results are summarized in Table 1.

Example 4

A vertical light-emitting diode was manufactured in the same manner as in Example 1, except that in the exposure of the rear plane of the n-type AlN single crystal substrate of Example 1, CMP of the nitrogen polar plane of the HVPE process n-type AlN substrate was not carried out. The area of all the openings was 1.77 mm$^2$ (number of openings: 9), and the proportion of the openings to the rear plane area of the chip was 55%.

The emission wavelength of the manufactured vertical light-emitting diode was 261 nm, and the operating voltage at a driving current of 100 mA was 94 V. The emission intensity distribution (minimum light intensity/maximum light intensity) on the light-emitting plane, as estimated from a near-field image of the light-emitting diode, was 0.82. These results are summarized in Table 1.

Example 5

A vertical light-emitting diode was manufactured in the same manner as in Example 1, except that in the formation of an n-electrode of Example 1, the shape of the opening was changed to a square (shortest distance: 250 μm) having one side of 500 μm. The area of all the openings was 1.5 mm$^2$ (number of openings: 6), and the proportion of the openings to the rear plane area of the chip was 46%.

The emission wavelength of the manufactured vertical light-emitting diode was 261 nm, and the operating voltage at a driving current of 100 mA was 33 V. The emission intensity distribution (minimum light intensity/maximum light intensity) on the light-emitting plane, as estimated from a near-field image of the light-emitting diode, was 0.73. These results are summarized in Table 1.

Comparative Example 1

A vertical light-emitting diode was manufactured in the same manner as in Example 1, except that in the formation of an n-electrode of Example 1, the diameter of the opening was changed to 1000 μm (shortest distance: 500 μm), and a single opening was provided at the center of the chip. The area of the opening was 0.79 mm$^2$ (number of openings: 1), and the proportion of the opening to the rear plane area of the chip was 24%.

The emission wavelength of the manufactured vertical light-emitting diode was 260 nm, and the operating voltage at a driving current of 100 mA was 30 V. The emission intensity distribution (minimum light intensity/maximum light intensity) on the light-emitting plane, as estimated from a near-field image of the light-emitting diode, was 0.66. These results are summarized in Table 1.

Comparative Example 2

A vertical light-emitting diode was manufactured in the same manner as in Comparative Example 1, except that CMP of the nitrogen polar plane of the HVPE process n-type AlN substrate was not carried out. The area of the opening was 0.79 mm$^2$ (number of openings: 1), and the proportion of the opening to the rear plane area of the chip was 24%.

The emission wavelength of the manufactured vertical light-emitting diode was 260 nm, and the operating voltage at a driving current of 100 mA was 95 V. The emission intensity distribution (minimum light intensity/maximum light intensity) on the light-emitting plane, as estimated from a near-field image of the light-emitting diode, was 0.68. These results are summarized in Table 1.

Comparative Example 3

A vertical light-emitting diode was manufactured in the same manner as in Comparative Example 2, except that the chip shape of the vertical ultraviolet light-emitting diode was changed to 1.1×1.1 mm. The area of the opening was 0.79 mm$^2$ (number of openings: 1), and the proportion of the opening to the rear plane area of the chip was 55%.

The emission wavelength of the manufactured vertical light-emitting diode was 260 nm, and the operating voltage at a driving current of 100 mA was 167 V. The emission intensity distribution (minimum light intensity/maximum light intensity) on the light-emitting plane, as estimated from a near-field image of the light-emitting diode, was 0.57. These results are summarized in Table 1.

TABLE 1

|  | Shape of opening | Shortest distance (μm) | Area of all openings/area of rear plane (%) | Semipolar plane (present or absent) | Thickness of damage layer (nm) | Operating voltage (V) | Emission intensity distribution |
|---|---|---|---|---|---|---|---|
| Ex. 1 | circle | 250 | 55 | absent | <10 | 37 | 0.81 |
| Ex. 2 | circle | 150 | 55 | absent | <10 | 35 | 0.87 |
| Ex. 3 | circle | 250 | 55 | present | <10 | 23 | 0.8 |
| Ex. 4 | circle | 250 | 55 | absent | 70 | 94 | 0.82 |
| Ex. 5 | square | 250 | 46 | absent | <10 | 33 | 0.73 |
| Comp. Ex. 1 | circle | 500 | 25 | absent | <10 | 30 | 0.66 |
| Comp. Ex. 2 | circle | 500 | 25 | absent | 70 | 95 | 0.68 |
| Comp. Ex. 3 | circle | 500 | 55 | absent | 70 | 167 | 0.57 |

In the examples, the emission intensity distribution was uniform even though the proportion of the area of the opening was large, and excellent luminous efficiency was achieved. In contrast with this, it can be seen that in the comparative examples, the emission intensity distribution was uniform even though the proportion of the area of the opening was small. It can also be seen that in the examples, the operating voltage was low. Moreover, it can be seen that when the semipolar plane was provided on the rear plane (Example 3) and when the damage layer was reduced, an ultraviolet light-emitting diode having more excellent properties could be obtained.

REFERENCE SIGNS LIST

1 n-Type AlN single crystal substrate
2 n-Type $Al_XGa_{1-X}N$ layer
3 Active layer
4 p-Type $Al_YGa_{1-Y}N$ layer
5 p-Type GaN layer
6 p-Electrode
7 n-Electrode
8 Opening (light extraction window)

The invention claimed is:

1. A vertical ultraviolet light-emitting diode having an emission peak wavelength in range of 210 to 300 nm, comprising:

on an aluminum polar plane of an n-type AlN single crystal substrate, a layer represented by n-type $Al_XGa_{1-X}N$, wherein x is a rational number satisfying $0.5 \leq X \leq 1.0$, an active layer, a layer represented by p-type $Al_YGa_{1-Y}N$, wherein Y is a rational number satisfying $0.5 \leq Y \leq 1.0$, and a p-type GaN layer in this order, the ultraviolet light-emitting diode is equipped with a p-electrode formed on the p-type GaN layer and an n-electrode formed on a plane on the opposite side to the aluminum polar plane of the n-type AlN single crystal substrate, the n-electrode being provided with at least one opening functioning as a light extraction window, the shortest distance between an edge of the n-electrode and an arbitrary point in the opening is not more than 400 μm, and in a portion where the n-electrode is formed on the n-type AlN single crystal substrate, a thickness of a damage layer at the portion from the n-type AlN single crystal substrate surface is not more than 50 nm.

2. The vertical ultraviolet light-emitting diode according to claim 1, having a plurality of the openings.

3. The vertical ultraviolet light-emitting diode according claim 1, wherein in a portion where the n-electrode is formed on the n-type AlN single crystal substrate, at least a part of the portion is a semipolar plane.

4. The vertical ultraviolet light-emitting diode according to claim 1, where in the n-type AlN single crystal substrate is a C-plane substrate.

5. The vertical ultraviolet light-emitting diode according to claim 4, wherein the C-plane substrate has an off angle of 0.2° to 0.5°.

* * * * *